(12) United States Patent
Plabst

(10) Patent No.: US 7,369,416 B2
(45) Date of Patent: May 6, 2008

(54) ELECTRICALLY SHIELDED MODULE CARRIER

(75) Inventor: Roland Plabst, Alling (DE)

(73) Assignee: Siemens Aktiengesellschaft, Munich (DE)

( * ) Notice: Subject to any disclaimer, the term of this patent is extended or adjusted under 35 U.S.C. 154(b) by 121 days.

(21) Appl. No.: 10/512,720

(22) PCT Filed: Jun. 13, 2003

(86) PCT No.: PCT/EP03/06221

§ 371 (c)(1),
(2), (4) Date: Oct. 28, 2004

(87) PCT Pub. No.: WO2004/006641

PCT Pub. Date: Jan. 15, 2004

(65) Prior Publication Data

US 2005/0168964 A1 Aug. 4, 2005

(30) Foreign Application Priority Data

Jul. 8, 2002 (DE) ................................ 102 30 704

(51) Int. Cl.
*H05K 9/00* (2006.01)
*H05K 7/14* (2006.01)

(52) U.S. Cl. ...................... 361/818; 361/800; 361/816; 361/799; 361/756

(58) Field of Classification Search ................ 361/756, 361/753, 799, 800, 816, 818, 752, 788, 796; 174/350; 211/41.17
See application file for complete search history.

(56) References Cited

U.S. PATENT DOCUMENTS

| 3,733,523 | A | * | 5/1973 | Reynolds et al. | 361/802 |
| 4,700,275 | A | * | 10/1987 | Wood | 361/729 |
| 5,023,754 | A | * | 6/1991 | Aug et al. | 361/800 |
| 5,027,089 | A | | 6/1991 | Henke | |
| 6,285,548 | B1 | | 9/2001 | Hamlet et al. | |
| 6,323,418 | B1 | * | 11/2001 | Tiburtius et al. | 174/387 |
| 6,325,472 | B1 | | 12/2001 | Tirrell et al. | |
| 6,442,035 | B1 | * | 8/2002 | Perry et al. | 361/756 |
| 6,646,868 | B2 | * | 11/2003 | Ho et al. | 361/684 |
| 6,683,792 | B2 | * | 1/2004 | Shirakami et al. | 361/796 |
| 6,963,495 | B1 | * | 11/2005 | Carullo et al. | 361/818 |
| 7,007,809 | B2 | * | 3/2006 | Greenside | 211/41.17 |
| 7,042,737 | B1 | * | 5/2006 | Woolsey et al. | 361/799 |
| 2002/0131257 | A1 | * | 9/2002 | Agard | 361/796 |
| 2003/0205541 | A1 | * | 11/2003 | Greenside | 211/41.17 |

FOREIGN PATENT DOCUMENTS

WO 93/15595 8/1993

* cited by examiner

Primary Examiner—Tuan T. Dinh
Assistant Examiner—Dameon E Levi
(74) Attorney, Agent, or Firm—Staas & Halsey LLP

(57) ABSTRACT

Electric or electronic modules may be carried by an electrically shielded module carrier that includes a cover element and a base element enclosing at least one mounting region which is divided into a front section and a rear section by an intermediate wall card. Holding elements for inserted flat modules are laterally provided in each section and include guiding gratings which face each other in pairs and are integrated into an electromagnetic shield. The cover element and the base element are connected to the guiding gratings of the front section in a fixed manner and are detachably connected to the guiding gratings of the rear section.

23 Claims, 6 Drawing Sheets

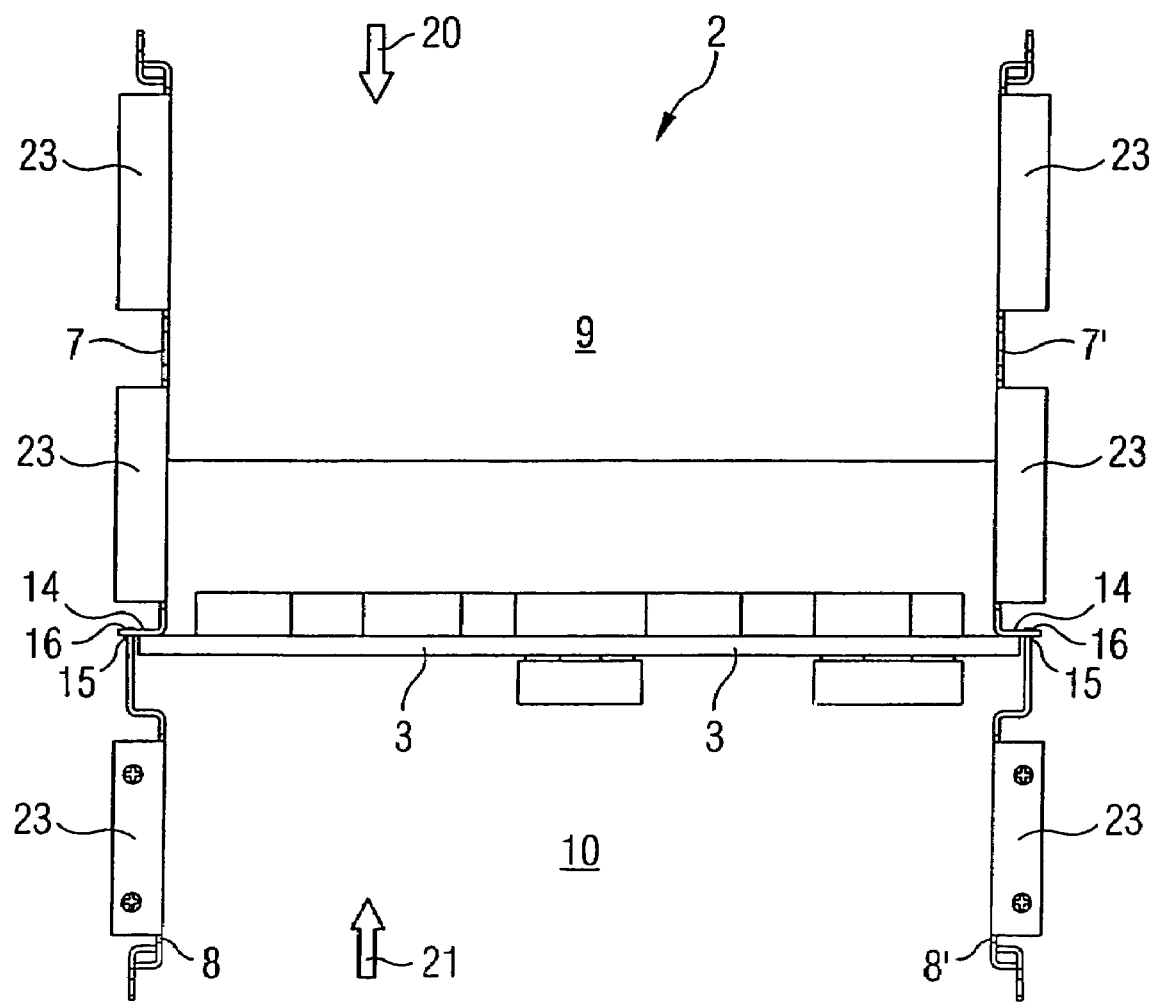

ELECTRICALLY SHIELDED MODULE CARRIER

CROSS REFERENCE TO RELATED APPLICATIONS

This application is based on and hereby claims priority to German Application No. 102 30 704.0 filed on Jul. 8, 2002, the contents of which are hereby incorporated by reference.

BACKGROUND OF THE INVENTION

1. Field of the Invention

The invention relates to an electrically shielded module carrier for receiving electric and/or electronic modules, the carrier including a cover element and a base element, with at least one mounting space, which is divided into a front section and a rear section by an intermediate wall card. Holding elements for inserted flat modules are provided laterally in each of these sections.

2. Description of the Related Art

Module carriers serve to receive different electric and electronic units. In many areas of electrical engineering, in particular in the area of communication technology, the problem arises that in the module carrier the mounting space for electronic units has to be protected against parasitic radiation, while electric components, such as fans, power supply units and cabling, also have to be housed in module carriers. If these electrical units themselves are not to be considered to be a source of interference, the manner in which they are housed in the module carrier requires comparatively fewer shielding measures.

Depending on the type of field to be shielded, different models and designs of shielding housing are known in electrical engineering.

To protect against electrostatic effects and slowly variable fields, it is known that the entire housing of an electrical device can be designed in the manner of a Faraday cage. Plate components made of steel, aluminum or special alloys are generally used for shielding devices, assembled using mechanical and electrical connections to form a conductive shielding jacket. Depending on the technical design of the connections, the mounting space to be protected is ideally field-free.

In the event of incident and emergent electromagnetic waves, the shield effect is determined by reflection and transmission at material interfaces and by absorption in the shielding wall. In order to satisfy the requirements of a perfect electromagnetic shield, the housing components have to be connected by a plurality of contact points, each with the lowest possible contact resistance. Structurally this means all-round contact of the joint areas with closely spaced contact points. Such all-round contact, which can be achieved by spot welding, screws, rivets, screened springs, contact lugs or flexible sheathed electric cables, requires corresponding expenditure.

A further problem results from the demand for increasing integration and component density. It has to be possible to insert the assembled printed circuit boards from the front and from the rear into the module frames, i.e. the covers at the front and rear of the module carrier, which are incorporated in the shield, have to be removable. With this model of module carrier the electrical connection of the printed circuit boards is effected by a connector card arranged across the direction of insertion. This connector card, hereafter referred to as the intermediate wall card, is also referred to in the literature as the midplane or double-sided backplane. It is generally arranged in the center of the module carrier and is provided with plug-in connectors on both sides. The printed circuit boards can be pushed into these connectors. A shared bus provides an electrical connection between the plug-in modules. The intermediate wall card also often contains active components and it must be accessible or such that it can be disassembled for service operations.

Given the structure of the module carrier, this means that the mounting space must be designed as a space with a high level of shielding both in the front and the rear sections. On the other hand the intermediate wall card must also be accessible and as simple as possible to mount during assembly. If, for reasons relating to shielding, the intermediate wall card also has to be integrated into the shield, the latter must make reliable contact with the shielded housing components.

From an economic point of view shielding costs should where possible be tailored to the respective shielding requirements in the module carrier. In other words, where the volume to be mounted is subject to less stringent requirements with regard to EMC, it should also be possible to reduce costs.

It should also be possible to mass-produce the module carrier, where possible with standard production tools.

A module frame with a central backplane is known from EP 0926937. The backplane is mounted on a backplane carrier. To mount the backplane there are two knobs in the central area of the module frame, which serve as axes of rotation and which are arranged both in the cover element and the base element. These knobs can be inserted by swiveling the backplane into cutouts on the backplane carrier, whereby the backplane can be positioned in the central area of the module frame. Production of the module frame is comparatively expensive, as the backplane carrier represents an additional component with additional production costs.

SUMMARY OF THE INVENTION

An aspect of the invention is to create a module carrier at low cost, with which the mounting space for electronic modules is reliably shielded from electromagnetic parasitic radiation and which can be produced economically in large numbers.

It is characteristic of the invention that the printed circuit boards are held by guiding gratings, which face each other in pairs in the mounting space and are integrated into an electromagnetic shield, whereby a cover element and a base element are connected in a fixed manner to guiding gratings in a front section and detachably to guiding gratings in a rear section.

As the front guiding gratings are connected in a fixed manner to the housing shells, a preassemblable unit results during production. This preassemblable unit significantly facilitates assembly of the intermediate wall card. The intermediate wall card can be inserted into the mounting space using known handling systems without complicated swivel movement and be assembled by driver drill. Compared with the related art there is no need for the backplane carrier and during assembly there is no need for the complex operation required to snap this additional component into place. This is advantageous for large-scale production.

The guiding gratings on the one hand carry out the function of holding the printed circuit boards and form lateral shielding walls with regard to EMC. A plurality of such mounting spaces with a high level of shielding can be arranged in a laterally adjacent manner on the module carrier, each separated by such shielding walls.

In one advantageous embodiment of the invention the sides of both the cover element and the base element are folded in a continuous manner. These folded edges create a mounting space with a lower level of shielding that is laterally adjacent to the mounting space with a high level of shielding for electric modules, e.g. fans, power supply units or refrigerator sockets. This mounting space with a lower level of shielding is less expensive to produce. Shielding costs are better tailored to shielding requirements.

In one advantageous embodiment of the invention each of the ends of the guiding gratings in the front section facing the intermediate wall card is provided with an arm and each arm forms a bearing section for the intermediate wall card. This means that the intermediate wall card has good contact and can easily be fixed using screws. The screws are positioned in the insertion direction and are easily accessible for automatic screwdrivers.

A further improvement in the shield effect is achieved by providing the ends of the guiding gratings of the rear section facing the intermediate wall card with tongue-shaped prongs, which engage in corresponding recesses in the arms and the exit-side ends of the tongue-shaped prongs projecting from the recesses are subject to plastic deformation. The plastic deformation can result from stamping, forging or twist-locking. Positive connection of the gratings by twist-locking is preferred. The twist-lock connection refers to each prong engaging the edge of the recess assigned to it in the contact area. This airtight connection ensures that the formation of an oxide layer is reliably prevented in the contact point. The same low level of ohmic resistance is maintained in the contact point during use. The twist-lock connection can be produced using an automatic production tool, which grips the end of the prong when the prong is inserted and twists the end. During assembly chamfering of the prongs facilitates insertion into the respective recess.

As well as this positive connection it is also conceivable that the ends of the guiding gratings facing the intermediate wall card might overlap and the shielding effect be produced by the overlap.

It is advantageous for the cover element and the base element to be welded to the guiding gratings of the front section and to be connected to the guiding gratings in the rear section by a screw connection. The material-positive welded connection not only ensures more reliable electrical contact but there is also a preassembled unit from the production point of view and this is significantly easier to handle during production than individual parts. Welding can be carried out economically using automatic welding tongs, which access the module carrier from the front and connect angled elements arranged on the base and cover sides of the guiding grating respectively to the cover element or base element. The interval between the weld points can easily be predefined with automatic welding tools. A weld point interval of around 25 mm has proven favorable for many applications in practice as far as EMC is concerned.

If the flat modules are arranged in the mounting space in parallel, horizontal insertion planes, it is favorable to provide recesses on the guiding gratings, which serve as openings for horizontally guided cooling air. Good heat dissipation from the printed circuit boards can be achieved by fans housed in a mounting space with a low level of shielding laterally adjacent to the mounting space with a high level of shielding.

The shielded module carrier can be produced on a large scale at particularly low cost, if the shield is made from a metal material with material uniformity in the form of a component produced by a combined cutting and bending process. Depending on the deployment site, it can be favorable to protect the surface of the components produced by a combined cutting and bending process against corrosion by a galvanic coating.

Mounting of the preassembled unit can be facilitated by affixing contact studs or contact lugs pointing in the direction of the joint to the guiding gratings and the folded edges of the housing shells.

The module carrier according to the invention is suitable for different fields of application in electrical engineering. One particularly preferred area of deployment is in the 19-inch series, as is generally used for communication systems.

BRIEF DESCRIPTION OF THE DRAWINGS

These and other objects and advantages of the present invention will become more apparent and more readily appreciated from the following description of an exemplary embodiment, taken in conjunction with the accompanying drawings, of which:

FIG. 6 is a top view of the device according to the invention without housing shells.

DETAILED DESCRIPTION OF THE PREFERRED EMBODIMENT

Figure 1:
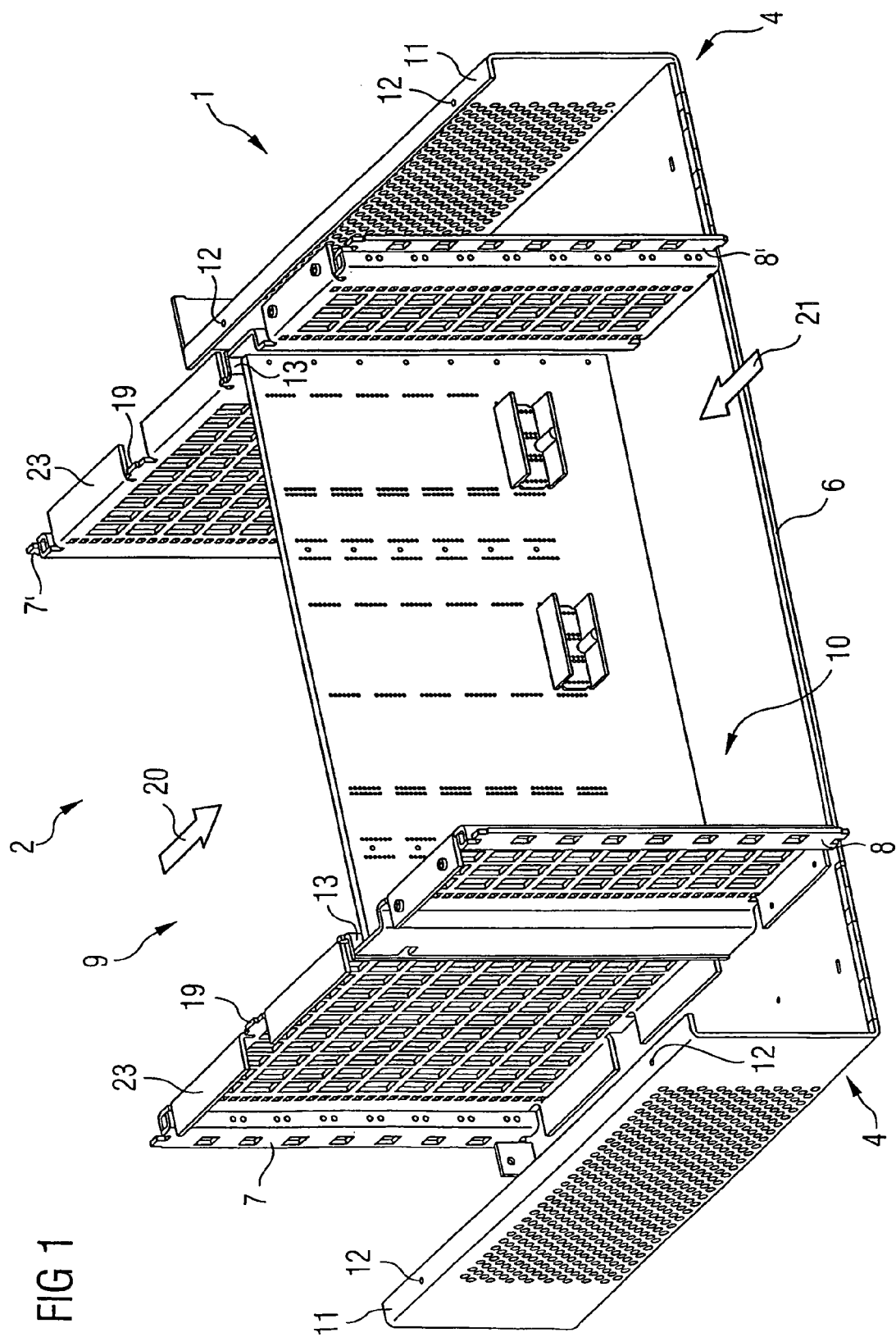
FIG. 1 is a perspective view of the module carrier according to the invention, in which the upper housing shell has been removed.

Reference will now be made in detail to the preferred embodiments of the present invention, examples of which are illustrated in the accompanying drawings, wherein like reference numerals refer to like elements throughout.

Figure 2:
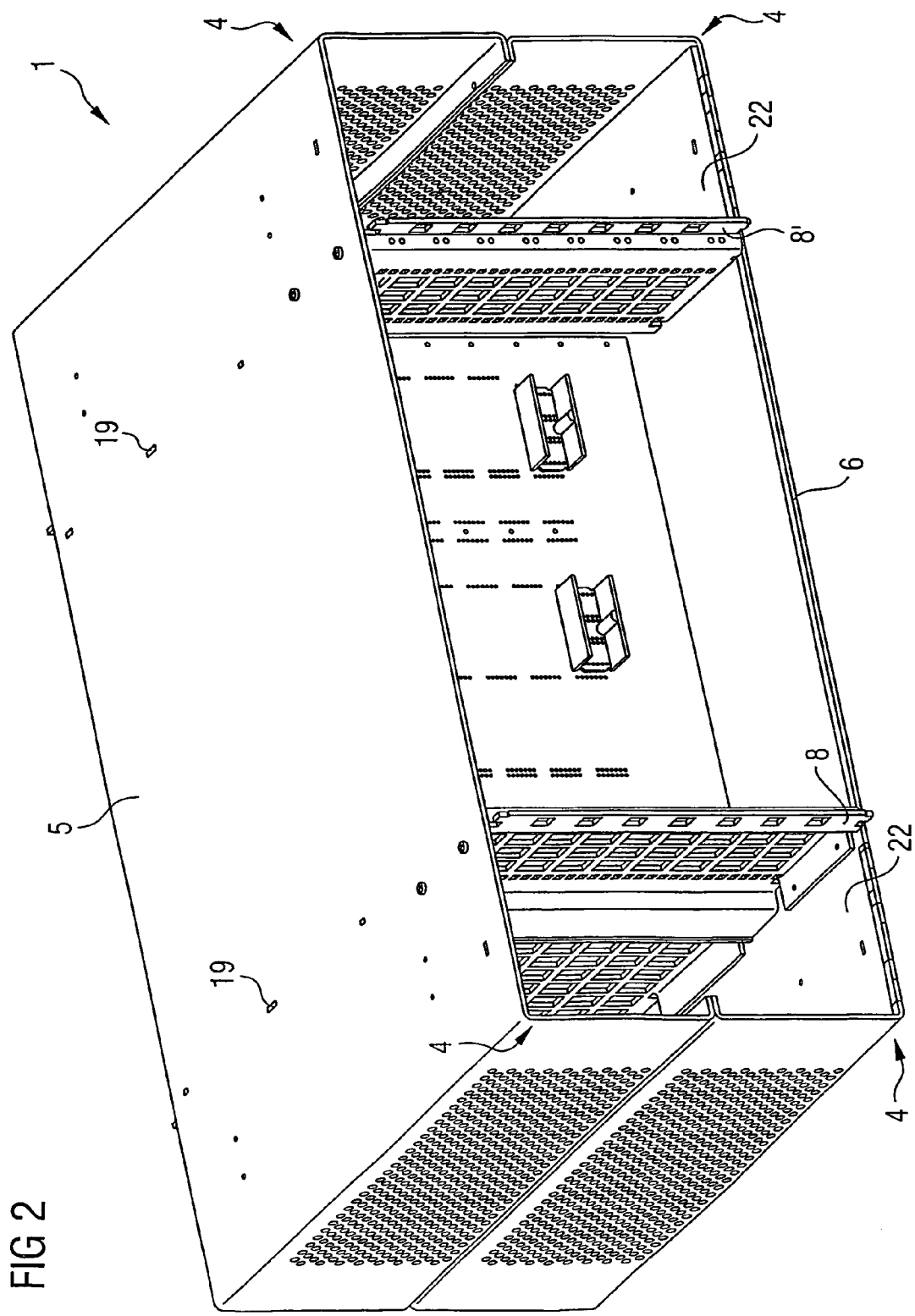
FIG. 2 is a perspective view of the module carrier as shown in FIG. 1 with the assembled cover element.

One exemplary embodiment of the module carrier 1 according to the invention is shown in the three-dimensional representation in FIG. 1 and FIG. 2. In the drawing in FIG. 1 the cover element 5 is removed and the mounting space 2 can be seen. Guiding gratings 7, 7', 8, 8' are arranged facing each other in pairs on a base element 6. They form lateral limits of a mounting space 2. An intermediate wall card 3 divides this mounting space into a front section 9 and a rear section 10. During production of the module carrier, in a first stage, the front guiding gratings 7, 7' are connected to the base element 6 and the cover element 5 by spot welding. Edges folded at right-angles 23 are provided on the cover and base sides of the guiding gratings for this purpose. The cover element 5 and base element 6 are configured as holohedral walls in the area of the shielded space 2.

Centering studs 19 are provided on the cover and base sides of the front guiding gratings. Centering lugs 12 are also configured on the projections 11 of the folded edges 4. During assembly the centering studs 19 or centering lugs 12 facilitate the mounting of the shield elements 5, 6, 7, 7', 8, 8'. Spot welding produces a preassembled unit, including the housing shells 6 and 5 and the front guiding gratings 7 and 7'. This preassembled unit facilitates further assembly. The intermediate wall card 3 can be inserted by automated handling systems in the rear section 10 and can be fixed to arms 13 of the guiding gratings 7, 7' using screws. The assembly point of the screw connection is easily accessible for driver drills, which access from the rear section 10. The rear guiding gratings 8, 8' are then screwed to the base element 6 and the cover element 5 (FIG. 2) in the rear section 10.

The intermediate wall card 3 is arranged off-center between the front guiding gratings 7, 7' and the rear guiding gratings 8, 8'. It extends in the mounting space 2 across the directions of insertion 20 or 21 and is limited laterally by the guiding gratings. The guiding gratings 7,7', 8,8' form lateral holding elements for flat modules. These assembled printed circuit boards can each be inserted in guides in the front section 9 or in the rear section 10. The guides can be formed by grooves in the guiding gratings or by guide clips, each of which can be snapped into the guiding grating. The inserted printed circuit boards are received by plug-in connectors arranged on both sides of the card 3. In FIG. 1 the direction of insertion in the front section 9 is marked by an arrow with the reference character 20; the arrow 21 shows the direction of insertion in the rear section 10.

The cover element 5, the base element 6 and the guiding gratings 7, 7', 8, 8' form sleeve elements of an electromagnetic shielding device, which can be closed off on the front face by front and rear plates (not shown).

As can be seen clearly from the representations in FIG. 1 and FIG. 2, the cover element 5 and base element 6 are each continued laterally in respect of the mounting space 2 by edges folded at right-angles 4 to form a U-shaped housing shell. This means that a space 22 is enclosed at each side of the mounting space 2, the shielding effect of which can be designed to be different from that of the mounting space 2, depending on requirements. This lateral space 22 can therefore be shielded to a lesser degree compared with the mounting space 2. This can be achieved simply by making the distance between the contact points of the spot welds in the joint area of the angled edge 11 larger and achieving contact with the front-face covers (not shown) at lower cost or more economically. This lateral space 22, which is shielded to a lesser degree, is very suitable for holding fans, power supply units or cabling. The space 22 forms a shielding prechamber for electromagnetic waves penetrating laterally. The lateral penetration of electromagnetic waves is obstructed by barriers in the form of the angled element 4 configured as a perforated wall and the shielding guiding gratings 7 and 8 or 7' and 8'. From a production point of view the lateral extensions to the housing cover and base elements are simple to produce and can easily be adapted to different shield effects.

Figure 3:
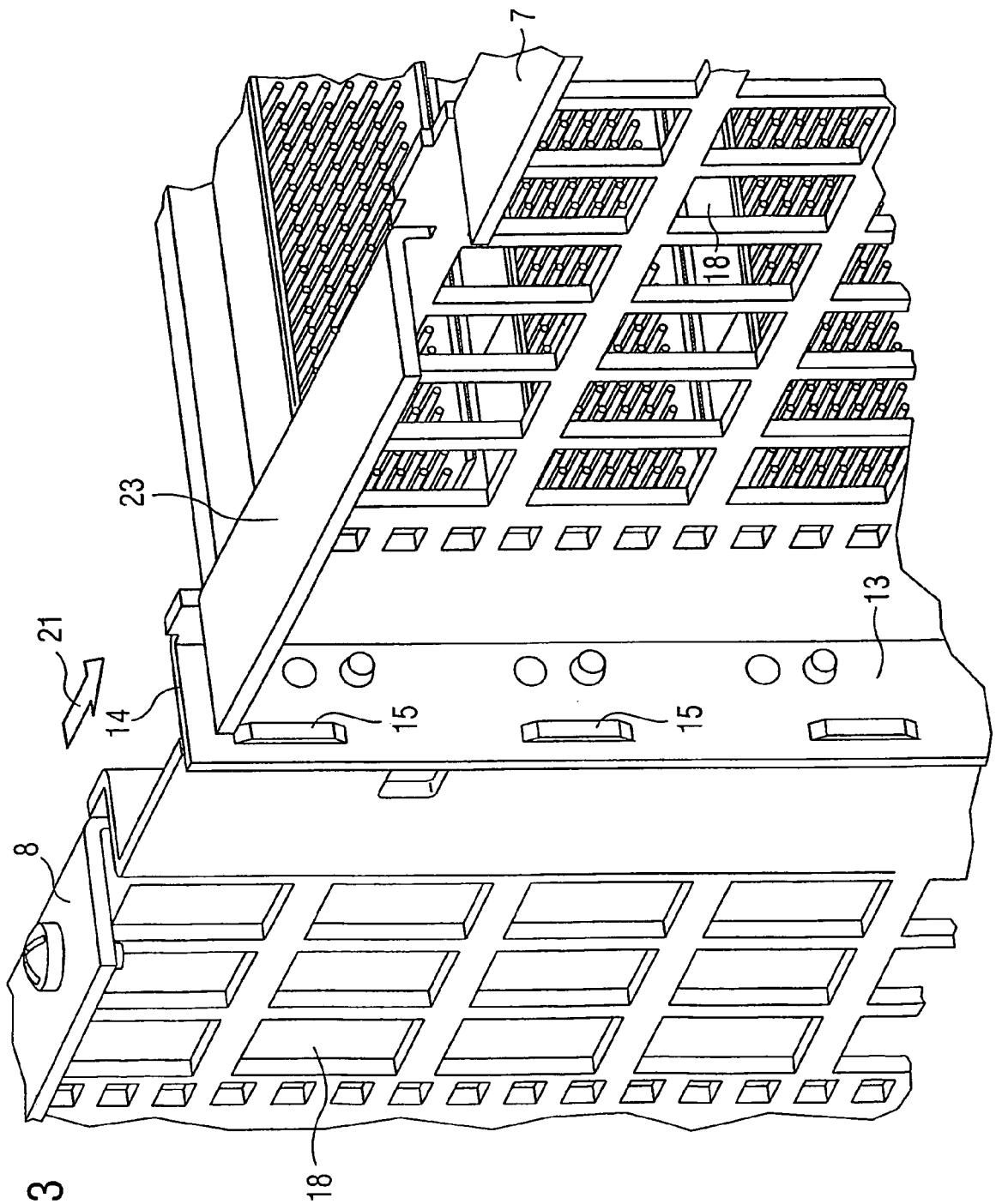
FIG. 3 is a perspective view of a greatly enlarged section of the module carrier in the area of the connection point between a front and a rear guiding grating.
Figure 4:
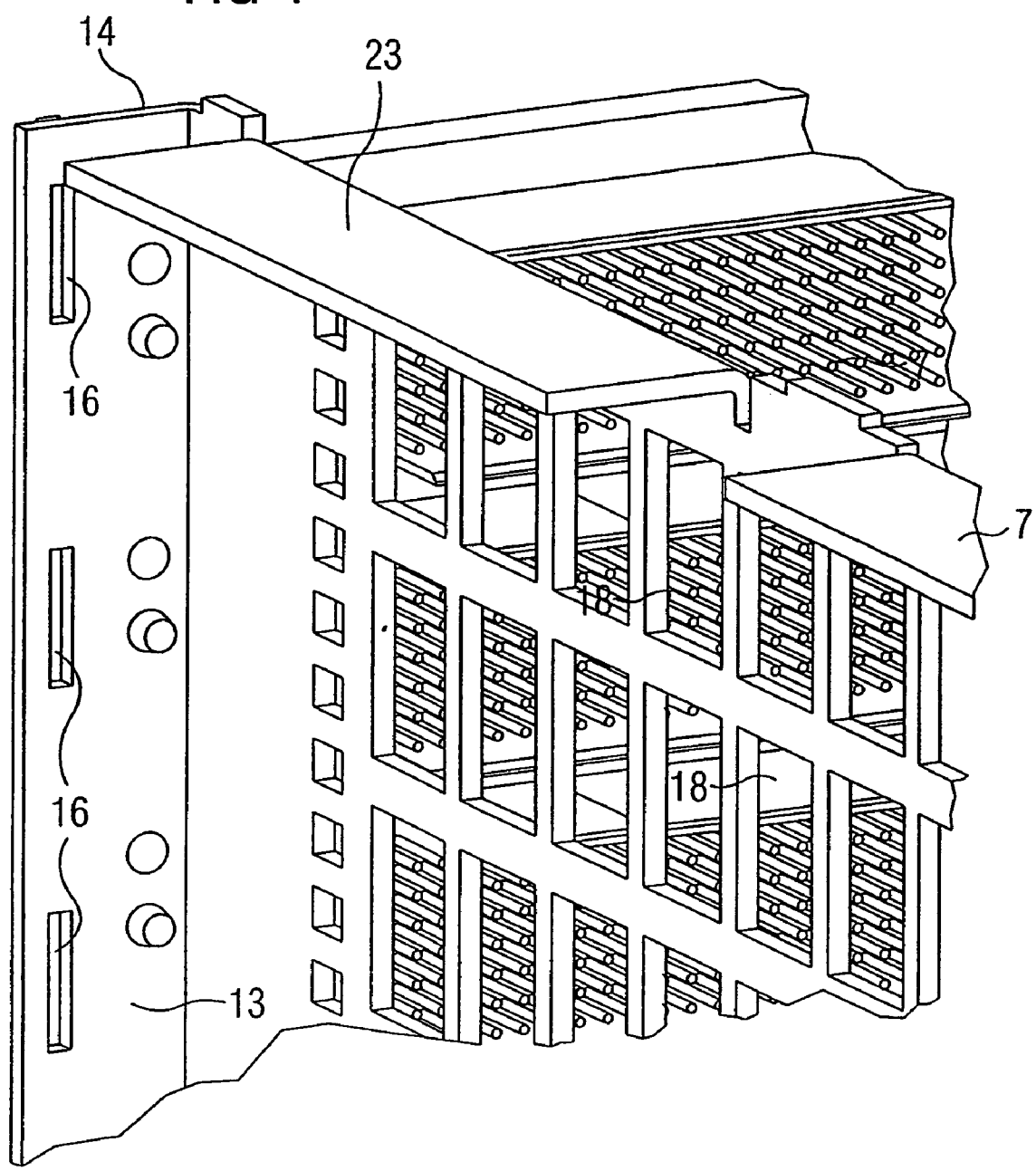
FIG. 4 is a perspective view of the front guiding grating with recesses for the prongs of the rear guiding grating.
Figure 5:
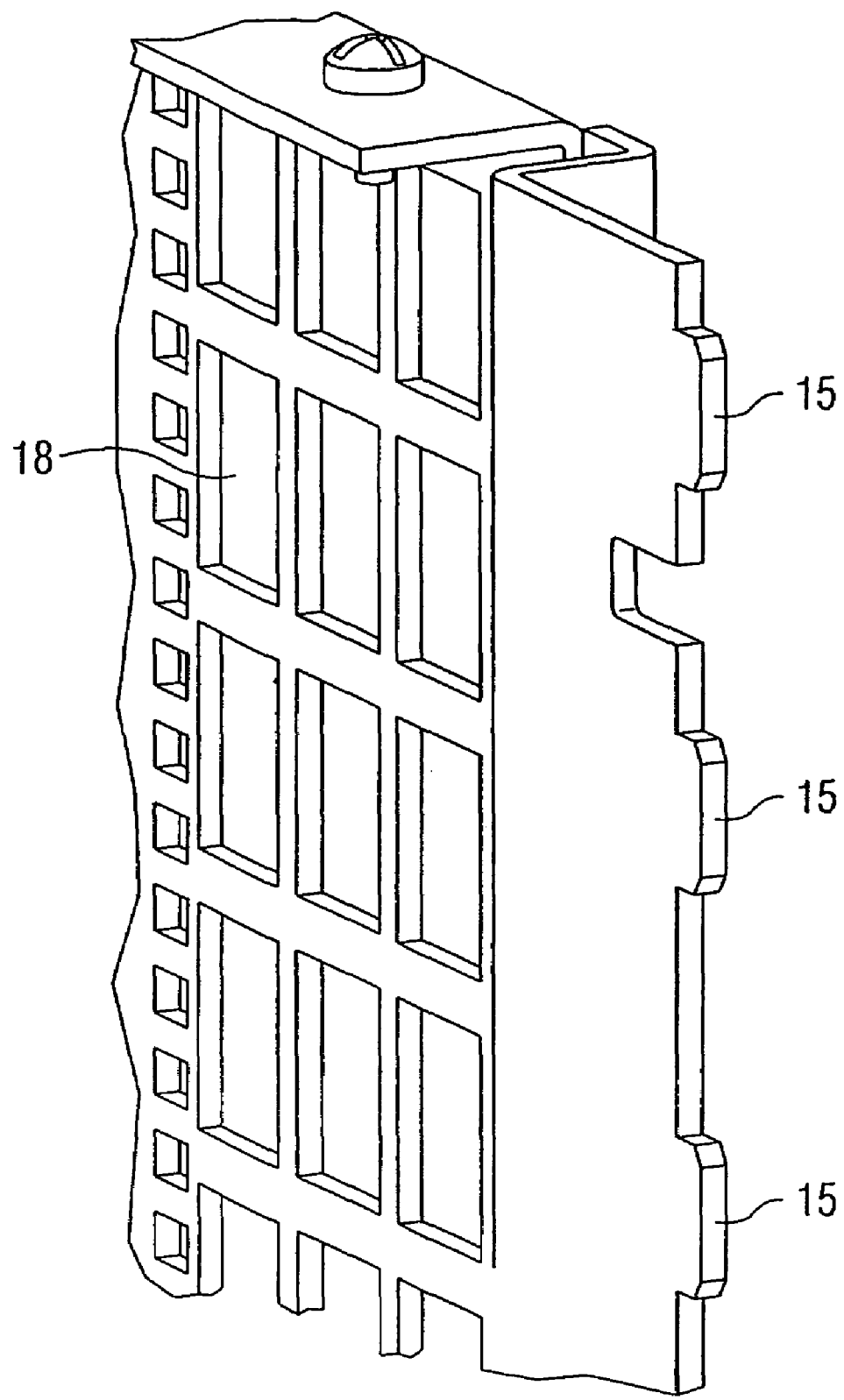
FIG. 5 is a perspective view of the rear guiding grating with tongue-shaped prongs.

FIG. 3 shows a significantly enlarged representation of a section of the module carrier 1 in the area of the connection point between a front guiding grating 7 and a rear guiding grating 8. The end of the rear guiding grating 8 is offset in the direction of insertion and has tongue-shaped prongs 15 at the end. These prongs 15 engage in corresponding recesses 16 (FIG. 4) of an arm 13 of the assigned front guiding grating 7. Twisting the end of the tongue-shaped prongs 15 produces a twist-lock, with which each prong beds into the recess 16, thereby creating an approximately airtight connection at least locally in the contact area. As shown in FIGS. 1 to 5, the guiding gratings 7, 7', 8, 8' have recesses 18. These cutouts 18 form openings for a flow of air guided horizontally in the module carrier. In many applications with an arrangement according to the invention good shielding efficiency can be achieved if rectangular holes with a diagonal smaller than 25 mm are used.

The folded edges 4 are configured as a perforated plate, with the result that lateral air ingress or air egress is possible when module carriers are stacked on top of each other. The many small holes in the perforated plate are a favorable embodiment for ventilation of the mounting space, as they have a good shielding effect. The form and dimension of the holes 18 are configured according to the electromagnetic waves to be screened.

FIG. 6 shows a top view of the interior of the shielded space 2, which is divided by the intermediate wall card 3 into a front section 9 and a rear section 10. The guiding gratings 7 and 8 or 7' and 8' face each other in pairs and are arranged in line in the direction of insertion 20 and 21. The intermediate wall card 3 is fixed by screw connections onto bearing sections 14 of the front guiding gratings 7, 7'. At their ends facing the card 3 each of the rear guiding gratings 8, 8' is offset to produce prongs 15. The prongs 15 engage in recesses 16 of the guiding gratings 7, 7'. The connection between abutting front and rear guiding gratings is effected by twist-locking the prongs 15 into corresponding recesses 16. The guiding gratings 7, 7' are welded along folded edges 23 in the front section 9 to the base or cover element; the folded edges 23 of the rear guiding grating 8, 8' are screwed to the cover or base element in the rear section 10 by screws with heads or through bolts. The depth of the rear mounting space 9 and therefore also the length of the rear guiding gratings 7, 7' is larger in the exemplary embodiment shown than the depth or length of the guiding gratings 8, 8' in the rear mounting space 10.

Plug-in connectors are arranged on both sides of the intermediate wall card 3. The intermediate wall card extends in the mounting space 2 across all the plug-in modules and physically provides a communication channel between the plug-in modules. It is often equipped with its own storage device and/or microprocessor as well as a bus for processing the data transmission between the plug-in modules. The arrangement in the module carrier 1 according to the invention allows the intermediate wall card 3 to be easily accessible for maintenance work due to the easy disassembly of the rear guiding grating 8, 8'.

Naturally a plurality of module carriers according to the invention can be arranged one on top of the other in a mechanical support, known as a rack. The width of such module carriers is generally 19" (48.3 cm).

The invention has been described in detail with particular reference to preferred embodiments thereof and examples, but it will be understood that variations and modifications can be effected within the spirit and scope of the invention covered by the claims which include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. An electrically shielded module carrier for receiving at least one of electric and electronic modules, comprising:
a cover element and a base element at least partially defining at least one mounting space;
an intermediate wall card dividing the at least one mounting space into a front section and a rear section; and
guiding gratings facing each other in pairs, forming lateral holding elements for the at least one of electric and electronic modules in each of the front and rear sections and forming an electromagnetic shield with said cover element and said base element which are fixedly connected to said guiding gratings of the front section and are detachably connected to said guiding gratings of the rear section, wherein said guiding gratings of the front section are substantially permanently connected to said cover element and said base element.

2. An electrically shielded module carrier according to claim 1, wherein said cover element and said base element form a housing shell and each includes at least one folded edge.

3. An electrically shielded module carrier according to claim 2, wherein said guiding gratings of the front section have ends facing said intermediate wall card with each end having an arm that forms a bearing section for said intermediate wall card.

4. An electrically shielded module carrier according to claim 3, further comprising at least one screw connection fixedly connecting said intermediate wall card to the bearing section.

5. An electrically shielded module carrier according to claim 4,
wherein each arm on the ends of said guiding gratings of the front section have recesses, and
wherein said guiding gratings of the rear section have ends with tongue-shaped prongs subject to plastic deformation and engaging the recesses of corresponding arms on the ends of said guiding gratings of the front section.

6. An electrically shielded module carrier according to claim 5, wherein each of the tongue-shaped prongs has an exit-side end passing through one of the recesses and twist-locked to engage the corresponding arms on the ends of said guiding gratings of the front section.

7. An electrically shielded module carrier according to claim 6, wherein the exit-side end of each of the tongue-shaped prongs is chamfered.

8. An electrically shielded module carrier according to claim 7, wherein said cover element and said base element are welded to said guiding gratings in the front section and connected to the guiding gratings in the rear section by at least one screw connection.

9. An electrically shielded module carrier according to claim 8, wherein said guiding gratings are provided with recesses, which form openings for a flow of air.

10. An electrically shielded module carrier according to claim 9, wherein the recesses in said guiding gratings are rectangular with a diagonal smaller than 25 millimeters.

11. An electrically shielded module carrier according to claim 10, wherein said cover element and said base element are connected by weld points to said guiding gratings of the front section.

12. An electrically shielded module carrier according to claim 11, wherein the weld points are arranged at intervals of less than 25 millimeters.

13. An electrically shielded module carrier according to claim 12, wherein said cover element, said base element and said guiding gratings are metallic material with material uniformity after undergoing a combined cutting and bending process in forming the electromagnetic shield.

14. An electrically shielded module carrier according to claim 13, wherein said cover element, said base element and said guiding gratings have a galvanic coating.

15. An electrically shielded module carrier according to claim 14, wherein the galvanic coating includes zinc.

16. An electrically shielded module carrier according to claim 15, wherein said guiding gratings have cover and base sides with centering studs.

17. An electrically shielded module carrier according to claim 16, wherein said intermediate wall card is positioned in the mounting space to produce an insertion length for the at least one of electric and electronic modules that is longer in the front section than in the rear section.

18. An electrically shielded module carrier according to claim 17, wherein the at least one of electric and electronic modules form at least part of a communication system.

19. An electrically shielded module carrier according to claim 5, wherein the exit-side end of each of the tongue-shaped prongs is chamfered.

20. An electrically shielded module carrier according to claim 3,
wherein each arm on the ends of said guiding gratings of the front section have recesses, and
wherein said guiding gratings of the rear section have ends with tongue-shaped prongs subject to plastic deformation and engaging the recesses of corresponding arms on the ends of said guiding gratings of the front section.

21. An electrically shielded module carrier according to claim 2,
wherein each arm on the ends of said guiding gratings of the front section have recesses, and
wherein said guiding gratings of the rear section have ends with tongue-shaped prongs subject to plastic deformation and engaging the recesses of corresponding arms on the ends of said guiding gratings of the front section.

22. An electrically shielded module carrier according to claim 1, wherein said guiding gratings of the front section have ends facing said intermediate wall card with each end having an arm that forms a bearing section for said intermediate wall card.

23. An electrically shielded module according to claim 1, wherein said cover element and said base element are non-detachably connected to the front section of said guiding gratings.

* * * * *